(12) United States Patent
Kaiser et al.

(10) Patent No.: US 6,868,028 B2
(45) Date of Patent: Mar. 15, 2005

(54) CIRCUIT CONFIGURATION FOR DRIVING A PROGRAMMABLE LINK

(75) Inventors: Robert Kaiser, Kaufering (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 71 days.

(21) Appl. No.: 10/600,911

(22) Filed: Jun. 20, 2003

(65) Prior Publication Data

US 2004/0032787 A1 Feb. 19, 2004

Related U.S. Application Data

(63) Continuation of application No. PCT/DE01/04786, filed on Dec. 18, 2001.

(30) Foreign Application Priority Data

Dec. 20, 2000 (DE) .......................................... 100 63 684

(51) Int. Cl.[7] .............................................. G11C 7/00
(52) U.S. Cl. ................................ 365/225.7; 365/189.12
(58) Field of Search ......................... 365/225.7, 189.12, 365/189.08, 200

(56) References Cited

U.S. PATENT DOCUMENTS

| 5,255,226 A | * 10/1993 | Ohno et al. ............ 365/189.12 |
| 5,313,424 A | 5/1994 | Adams et al. |
| 5,424,672 A | 6/1995 | Cowles et al. |
| 5,442,589 A | 8/1995 | Kowalski |
| 5,631,862 A | 5/1997 | Cutter et al. |
| 5,995,988 A | * 11/1999 | Freidin et al. ............... 708/232 |

FOREIGN PATENT DOCUMENTS

FR          2 611 400 A1       9/1988

* cited by examiner

*Primary Examiner*—Son T. Dinh
(74) *Attorney, Agent, or Firm*—Laurence A. Greenberg; Werner H. Stemer; Ralph E. Locher

(57) ABSTRACT

A circuit configuration for driving a programmable link has a drive circuit for the selection and blowing of the fuse, and also a shift register, by which an activation signal can be fed to the drive circuit. In order to provide the data to be blown, in a preferred embodiment, a volatile memory cell may be provided. The present circuit configuration enables the blowing of fuses and thus repair of defective memory cells in mass memories even after encapsulation of a chip having the mass memory. Moreover, the shift register described effectively prevents impermissibly high currents from being able to occur as a result of simultaneous blowing of too many fuses.

9 Claims, 1 Drawing Sheet

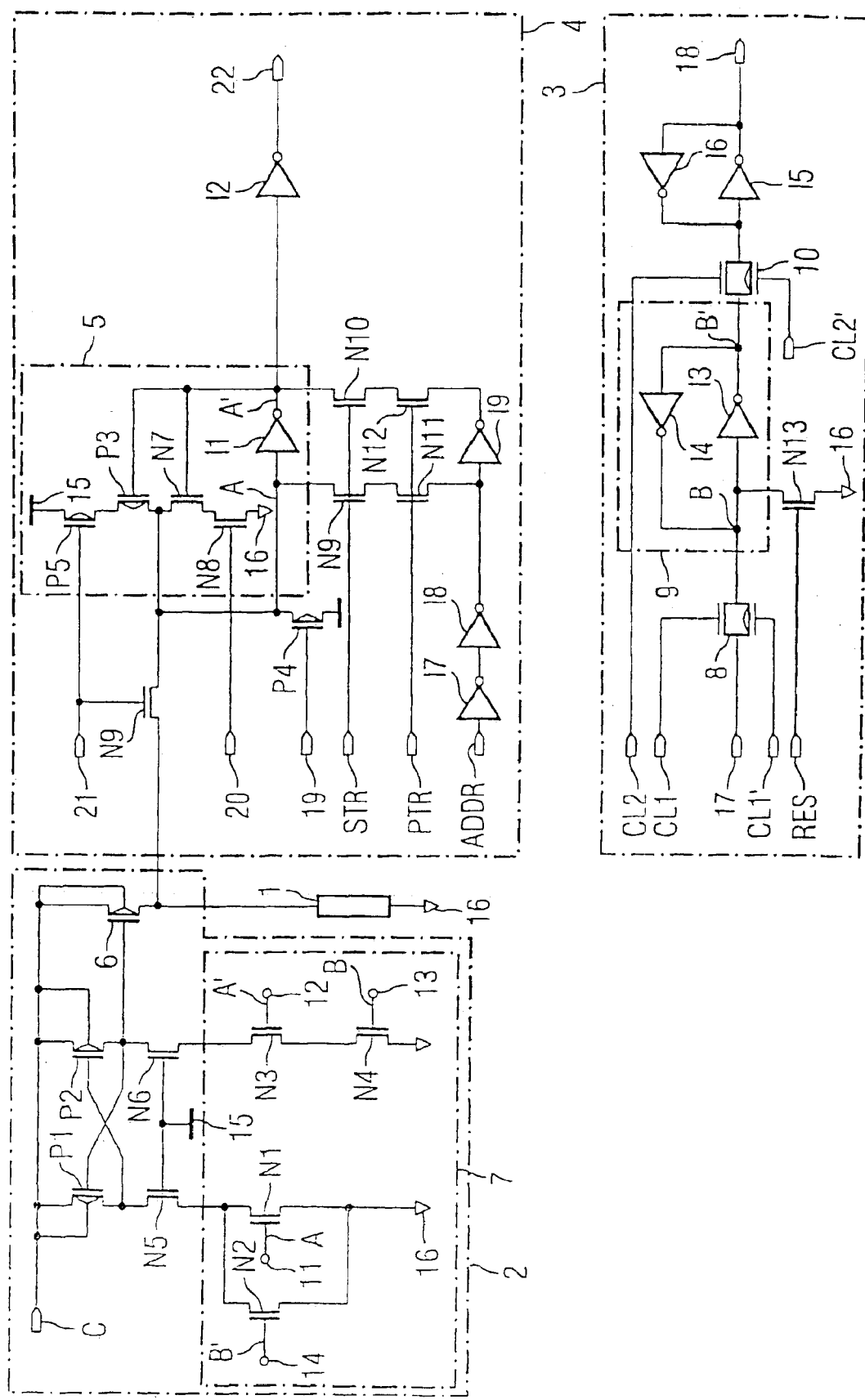

CIRCUIT CONFIGURATION FOR DRIVING A PROGRAMMABLE LINK

CROSS-REFERENCE TO RELATED APPLICATION

This application is a continuation of copending International Application No. PCT/DE01/04786, filed Dec. 18, 2001, which designated the United States and was not published in English.

BACKGROUND OF THE INVENTION

FIELD OF THE INVENTION

The present invention relates to a circuit configuration for driving a programmable link and to the use thereof in a memory chip.

In memory chips, for example synchronous dynamic random access memories (SDRAMs) having a memory space of 256 megabytes, for example, replacement memory cells which can compensate for production-dictated failures of individual memory cells are usually provided for the process of providing redundancy. For this purpose, programmable links, also referred to as fuses, are provided, which enable defective memory cells to be replaced by replacement cells. A few thousand fuses are provided in 256 megabyte RAMs, by way of example.

The fuses can be permanently changed over in a known manner either by an energy pulse in the form of a laser or by an electrical pulse, for example a voltage or a current pulse. In this case a distinction is made between what are called fuses, which can be put into a non-conducting (high-impedance) state from a conducting (low-impedance state) by use of the energy pulse described, and antifuses, which can be changed from a non-conducting state to a conducting state by application of an energy pulse.

The so-called activation or blowing of fuses, which is a one-time operation which permanently changes the fuse from a low-impedance to a high-impedance state or from a high-impedance state to a low-impedance state, has usually been effected hitherto by lasers prior to encapsulation of the memory chip. However, this is associated with the disadvantage that it is no longer possible to repair defective memory cells after encapsulation of the chip.

Furthermore, it is customary to replace the memory cells of an entire word line in a memory chip, but the replacement of individual addresses of memory cells, so-called single address repair, is desirable.

When fuses are blown by current or voltage pulses, which is also possible, in principle, after encapsulation of a chip, the problem arises, however, that the simultaneous blowing of a plurality of fuses entails an impermissibly high current consumption of the circuit.

SUMMARY OF THE INVENTION

It is accordingly an object of the invention to provide a circuit configuration for driving a programmable link which overcomes the above-mentioned disadvantages of the prior art devices of this general type, which enables repair of defective memory cells in an electronic mass memory even after encapsulation and in which an impermissibly high current consumption does not occur.

With the foregoing and other objects in view there is provided, in accordance with the invention, a circuit configuration. The circuit configuration has a programmable link being programmable with regard to its state of conduction by an energy pulse, and a drive circuit having an input side with an activation input and an output providing the energy pulse. The drive circuit is coupled to the programmable link in a manner dependent on signals present on the input side. A shift register is provided and has at least one register cell for storing an activation signal. The shift register is coupled to the activation input of the drive circuit for activating the drive circuit in a manner dependent on a memory content of the register cell.

The programmable link may be configured as a fuse or as an antifuse.

The register cell of the shift register may be connected, at its output, to an input of a further shift register cell of a further circuit configuration, as described above. A register chain may be formed in this case, it being possible for each register cell to be assigned a programmable link. A bit pattern generator may be connected to the input of a first register cell in the shift register chain. The bit pattern generator, depending on the maximum permissible current for blowing the programmable links, enables for example one or more ones to be successively shifted through the register chain in a clock-controlled manner. If a 1 is stored in a register cell during a clock phase, then the associated drive circuit is activated, so that the programmable link can be blown in this case for example in a manner dependent on a data signal.

An address for addressing a memory cell, which may be defective, in a memory chip may have a memory requirement of a plurality of bits, for example 25 bits. The circuit configuration described is preferably configured for storing an individual bit. In this case, the bit may advantageously be both stored rapidly in the volatile memory and stored permanently by use of the programmable link. In order to be able to store a complete address, as described above with 25 bits, 25 of the circuit configurations described may be provided. In this case, the shift registers of the individual circuit configurations may be connected to one another to form a shift register chain, as already described. This enables simple reprogramming of defective memory cells and replacement thereof by redundant, intact memory cells.

The circuit configuration described enables blowing of programmable links, for example in SDRAMs, even after encapsulation of a semiconductor chip that has a multiplicity of memory cells. Moreover, it is possible in a simple manner to prevent a maximum permissible current from being exceeded during the blowing of the programmable links. By use of the shift register, it is also possible for individual programmable links or fuses to be blown in a targeted manner, for example after a first attempt has been unsuccessful, by a logic 1 being shifted in a targeted manner into the desired register cell assigned to the relevant programmable link.

The blowing operation itself may be effected for example by applying a blowing voltage to all the drive circuits, which may be assigned to a respective register cell and to a respective programmable link.

In a preferred embodiment of the present invention, provision is made of a volatile memory with a memory cell, which is coupled to a data input of the drive circuit, for permanently storing the memory content of the memory cell of the volatile memory by use of the programmable link.

The memory cell in the volatile memory may be provided for example for storing a bit of an address information item of a defective memory cell in the SDRAM. The programmable link may be blown, upon application of a blowing voltage, for example, only when there is both a 1 stored in the memory cell of the volatile memory and a 1 stored in the register cell of the shift register. For this purpose, by way of example, the drive circuit may have a data input, connected to the memory cell of the volatile memory, and an activation input, connected to the register cell of the shift register. Moreover, storing defective memory addresses in the volatile memory makes it possible to correct or repair defective memory cells in the SDRAM in real time, since, for example in the case of a clock rate of 100 MHz, that is to say in the case of a period duration of 10 nanoseconds, it is not possible to blow a programmable link.

Furthermore, the volatile memory may also be connected to the programmable link for the read-out of the programmable link, so that, by way of example, the information of whether the programmable link has been blown or has not yet been blown can be transferred as logic 0 or logic 1 into the volatile memory, more precisely the memory cell thereof.

In a further preferred embodiment of the present invention, the programmable link is configured as an antifuse which, upon application of the energy pulse, permanently changes from a nonconducting to a conducting state. By way of example, two electrodes coupled to one another by a dielectric may be provided, the dielectric initially having an insulating effect, so that the electrodes are connected to one another with a high impedance. However, if an energy pulse, for example a voltage of 6 volts, for example, is applied across the electrodes of the antifuse, then the dielectric breaks down, resulting in a permanently low-impedance connection between the two electrodes, that is to say between two terminals of the antifuse. As an alternative, the programmable link may also be a fuse.

In a further preferred embodiment of the present invention, the drive circuit contains a blowing transistor, whose control input is connected to an activation and data input and which, in a manner dependent on signals present at the activation and data input; connects one terminal of its controlled path, at which a blowing voltage can be fed in, with a low impedance to a further terminal of the controlled path, which is coupled to the programmable link. The blowing transistor enables the driving and blowing of the programmable link by a voltage pulse in a simple manner.

In a further advantageous embodiment of the present invention, a circuit for level boosting is provided on the input side of the blowing transistor. The circuit for level boosting may be connected for example to a control input and also to a first load terminal of the blowing transistor. The programmable link may be connected to a load terminal of the blowing transistor with respect to a supply voltage terminal. The circuit for level boosting converts logic levels of input signals that can be fed to the circuit for level boosting into a higher logic level at the output of the circuit for level boosting. This makes it possible to ensure that a sufficiently high level is available at the control input of the blowing transistor in order to ensure that the latter is reliably turned off even when the blowing transistor switches a comparatively high blowing voltage. The input level at the circuit for level boosting lies in a range of 0 volts to 2.5 volts, for example. By way of example, a shifted logic level in a range of 0 volts to 4 volts is then provided on the output side of the circuit for level boosting. This ensures that a blowing transistor connected to the output of the circuit for level boosting by its control input can reliably turn off even a high blowing voltage of 4 volts, for example.

In a further preferred embodiment of the present invention, the drive circuit has an AND logic circuit which combines the activation and data input and, on the output side, is coupled to the programmable link.

In a further preferred embodiment of the present invention, the shift register contains a first switch, which can be controlled by a first clock signal and couples an input of the shift register to an input of the register cell, and contains a second switch, which can be controlled by a second clock signal and couples an output of the register cell to an output of the shift register.

With first and second clock signal, logic ones, for example, can be shifted successively through a plurality of register cells of serially interconnected shift registers, it being possible for each shift register to be assigned to a respective drive circuit of a respective programmable link.

In a further preferred embodiment of the present invention, the circuit configuration is constructed using CMOS circuit technology.

In a further preferred embodiment of the present invention, the latter is provided in an SDRAM chip.

10,000 circuit configurations described may be provided in a 256-megabyte SDRAM, for example. By way of example, the register cells respectively provided may all be cascade-connected, or a plurality of sections connected in parallel may be provided, the sections each having a multiplicity of serially cascade-connected register cells.

Other features which are considered as characteristic for the invention are set forth in the appended claims.

Although the invention is illustrated and described herein as embodied in a circuit configuration for driving a programmable link, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a circuit diagram of an exemplary embodiment of a circuit configuration according to the invention.

DESCRIPTION OF THE PREFERRED EMBODIMENTS

Referring now to the single FIGURE of the drawing in detail, there is shown a programmable link 1, which is configured as an antifuse and is connected to a supply voltage terminal 16 by one terminal and to a drive circuit 2 by a further terminal. The drive circuit 2 is connected to a shift register 3 for the feeding in of an activation signal B, B'. Furthermore, a volatile memory 4 is provided, which, on the one hand, is connected to the further terminal of the antifuse 1 for reading out the state thereof and, on the other hand, is connected to the drive circuit 2 for feeding a data signal A, A' to a data input 11, 12.

The drive circuit 2 contains an AND logic circuit 7, which combines the data signal A, A' and the activation signal B, B' with one another in a logical AND combination. Two NMOS transistors N1, N2 connected in parallel are provided for this purpose, of which a first NMOS transistor N1 has a control input connected to the data input 11, and a second NMOS transistor N2 has a control input having an activation input 14 for feeding in the activation signal B. Furthermore, further NMOS transistors N3, N4 are provided in the AND logic circuit 7 for feeding in respectively complementary or inverse data and activation signals A', B', which transistors are connected in series by their controlled paths, and of which transistors a first NMOS transistor N3 has a control input connected to a data input 12, for feeding in the complementary data signal A', and a second NMOS transistor N4 has a control input connected to an activation input 13 for feeding in a complementary activation signal B'.

The NMOS transistors N1, N3 with the data input 11, 12 are simultaneously part of a circuit for level boosting which, on the control side, is connected to a blowing transistor 6. The circuit for level boosting, which is part of the drive circuit 2, has two cross-coupled PMOS transistors P1, P2, which are connected to the AND logic circuit 7 via further NMOS transistors N5, N6. On the output side of the circuit for level boosting P1, P2, N5, N6 there is connected the blowing transistor 6 embodied as a PMOS transistor which is connected by a load terminal to the antifuse 1 and also to the volatile memory 4 for reading out the state of the antifuse 1.

The volatile memory 4 contains a memory cell 5 formed from two inverters I1; P3, N7 connected to one another. In this case, a first inverter I1 is provided, at whose input the data signal A can be derived and at whose output a complementary or inverse data signal A' can be derived. A PMOS transistor P3 and an NMOS transistor N7, whose control inputs are connected to one another and to the output of the first inverter I1, form the second inverter, whose output is connected to the input of the first inverter I1. The inverters I1 and P3, N7 thus form, as memory cell, a feedback latch with self-latching.

At the memory cell 5, auxiliary inputs 19, 20, 21 are provided for the purpose of reading out the present state of the antifuse 1. First, with auxiliary input 19 and a PMOS transistor P4 connected thereto by its control input, for reading out the state of the antifuse 1, a logic 1 is written to the memory cell 5 and self-latched there. Afterward, with auxiliary inputs 20, 21, which drive mutually complementary CMOS transistors P5, N8 of the memory cell 5, a tristate is formed in the memory cell 5, which connects the memory cell 5, in particular the inverter P3, N7, to the supply voltage terminals 15, 16 in a high-impedance manner. An NMOS transistor N9 is opened at the same time, which transistor is likewise connected to auxiliary input 21 for its control and is connected between a terminal of the antifuse 1 and an input of the memory cell 5. This has the effect that the circuit node at the input of the first inverter I1 in the memory cell 5 remains at high impedance if the antifuse 1 is likewise at high impedance, and undergoes transition to a low-impedance state if the antifuse 1 configured as an antifuse is at low impedance, that is to say has already blown. In the latter case, the input node of the first inverter I1, which provides the data signal A, discharges via transistor N9 and the antifuse 1, which is conducting in this case. As soon as the state of the antifuse 1, that is to say whether the antifuse is conducting at low impedance or at high impedance, is read out as logic 0 or 1 into the memory cell 5, the signals applied to the auxiliary inputs 20, 21 for this purpose are removed and the memory cell 5 undergoes transition to self-latching again. By use of an inverter I2, which is connected to the output of the first inverter I1 by its input, the data signal A or the inverse data signal A' can be read out from memory cell 5 at an output 22. Furthermore, the memory cell 5 is coupled to an address input ADDR, which, on the input side, is connected to three series-connected inverters I7, I8, I9.

Furthermore, for coupling the address input ADDR to the memory cell 5, two pairs of NMOS transistors N9, N10; N11, N12 are provided, the control inputs of which are connected to a strobe input STR and to a pointer input PTR. By the strobe and pointer signals on the selection lines STR, PTR, a bit of an address of a memory cell of an SDRAM, for example, can be written to the memory cell 5, in which case the memory cell in the SDRAM to which points the address of which one bit can be fed in at the input ADDR may be defective. If the address is defective, then the bit of the relevant defective memory cell address that is present at the address input ADDR can be written to the memory cell 5 by the selection lines STR, PTR, which can be activated for this purpose.

Permanent storage of the bit of the address of the defective memory cell cannot be made possible with the memory cell 5, however, since the latter only forms a volatile memory. Therefore, the drive circuit 2 described enables the read-out of the memory cell 5, that is to say of the data signal A, A' via the AND control logic 7 already described and also the permanent storage of the datum read out by the blowing transistor 6 in the antifuse 1. In this case, the AND logic circuit 7 combines the data signal A, A' with an activation signal B, B' in an AND combination. Consequently, the antifuse 1 is blown only when a logic 1 is stored in memory cell 5 and, in addition, a logic 1 is provided by the activation signal B, B' at the activation input 13, 14. Finally, a blowing operation for the antifuse 1 in accordance with the exemplary embodiment also requires a blowing voltage C to be present at the PMOS transistors P1, P2, which form the level boosting circuit already described, and at the blowing transistor 6.

In accordance with the present invention, the activation signal B, B' can then be provided by the shift register 3 in the register cell 9, which likewise has two negative feedback inverters I3, I4 which form a self-latching circuit. A switch 8, 10 embodied as a PMOS transfer gate is respectively connected to the input of the register cell 9 and to the output of the register cell 9. While the switch 8 connected on the input side can be driven by a first clock signal CL1, CL1', the switch 10 disposed on the output side can be driven by a second clock signal CL2, CL2', which can fed to the switch 10. The memory content of the register cell 9 can be reset via an NMOS transistor N13, which connects the input of the memory cell 9 to a supply voltage terminal 16, and which is connected to a reset input RES on the control side. On the output side of register cell 9 and connected downstream of the output-side switch 10, the shift register 3 has a further self-latching circuit, which is realized with two likewise negative feedback inverters I5, I6 and couples the switch 10 to an output 18 of the shift register 3. The input of the shift register 3 that is connected to an input of the input-side switch 8 is designated by 17.

As already described, memory cells in SDRAM chips, which may have a memory space of 256 megabits, for example, are selected by use of the addresses. Such an address may have 25 bits, for example. Accordingly, 25 of the circuits shown in the FIGURE, containing the antifuse 1, the drive circuit 2, the volatile memory 4 and the shift register 3, are necessary for the addressing of an individual memory cell of an SDRAM chip. However, in order to avoid an impermissibly high current flow, which may momentarily amount to approximately 1 mA per antifuse, during the blowing of the antifuses 1, the individual drive circuits 2 for the antifuses 1 with shift register 3 may be selected or addressed successively or partly simultaneously. For this purpose the plurality of shift registers 3 can be connected to one another in a series circuit, in which case an input 17 of one shift register circuit 3 can respectively be connected to an output 18 of another shift register circuit 3. A shift register chain is formed as a result of this. The register cells 9 respectively connected to one another via switches 8, 10 can also be interpreted as a register. A bit pattern generator, not depicted in the present FIGURE, may be connected to the input of the first register cell. If only one antifuse is permitted to be blown at any one time, then a bit sequence which has only one logic 1 and is filled with zeros can be provided by the bit pattern generator at the input of the shift register chain. The logic 1 is then successively shifted through all the register cells 9 of the shift register, so that only one drive circuit 2 is activated at that time in each case by the respective activation signal B. The clock signals CL1, CL1' and CL2, CL2' are provided for controlling the sequence. If a plurality of antifuses 1 can be blown simultaneously, then it is also possible, of course, by use of the shift register 3, for a plurality of directly successive ones or ones spaced apart by zeros at an adjustable interval to be shifted through the shift register chain.

The circuit configuration described, with the fast volatile memory 4, enables a correction of defective memory cells in a mass memory chip in real time. By way of example, before the mass memory chip is switched off, the respective addresses of the defective memory cells can be written permanently, for which purpose the drive circuits 2 and the antifuse 1 are provided. Consequently, blowing of the antifuses 1 for the permanent storage of defective addresses, more precisely addresses of defective memory cells, is made possible. This is still possible even after the encapsulation and housing of the mass memory chip, since the antifuse 1 is electrically drivable. Finally, the invention affords the advantage that not only can an impermissibly high blowing current occur as a result of the simultaneous blowing of too many antifuses, but that in addition an arbitrary number of antifuses 1 can be blown simultaneously and in an arbitrary order by bit patterns that can be generated arbitrarily and can be shifted through the register cells 9.

We claim:

1. A circuit configuration, comprising:
   a programmable link being programmable with regard to its state of conduction by an energy pulse;
   a drive circuit having an input side with an activation input and an output providing the energy pulse, said drive circuit coupled to said programmable link in a manner dependent on signals present on said input side; and
   a shift register having at least one register cell for storing an activation signal, said shift register coupled to said activation input of said drive circuit for activating said drive circuit in a manner dependent on a memory content of said register cell.

2. The circuit configuration according to claim 1, wherein said input side has a data input; and
   further comprising a volatile memory cell coupled to said data input of said drive circuit for communicating a data signal for permanently altering the state of conduction of said programmable link in a manner dependent on a memory content of said volatile memory cell.

3. The circuit configuration according to claim 2, wherein said programmable link is an antifuse which, upon application of the energy pulse, permanently changes from a non-conducting state to a conducting state.

4. The circuit configuration according to claim 2, wherein:
   said drive circuit contains a blowing transistor having a control input coupled to said activation input and to said data input and a controlled path with a first terminal for receiving a blowing voltage and a second terminal coupled to said programmable link; and
   said blowing transistor, in a manner dependent on signals present at said activation and data inputs, connects said first terminal of said controlled path, at which the blowing voltage is received, with a low impedance to said second terminal of said controlled path, which is coupled to said programmable link.

5. The circuit configuration according to claim 4, wherein said drive circuit has a circuit for level boosting coupled to said blowing transistor.

6. The circuit configuration according to claim 2, wherein said drive circuit has an AND logic circuit, which combines said activation and data inputs with one another in an AND logic, said AND logic circuit having an output side coupled to said programmable link for driving said programmable link.

7. The circuit configuration according to claim 1, wherein:
   said register cell has an input and an output; and
   said shift register has an input, an output, a first switch receiving and controlled by a first clock signal for coupling said input of said shift register to said input of said register cell, and a second switch receiving and controlled by a second clock signal for coupling said output of said register cell to said output of said shift register.

8. The circuit configuration according to claim 1, wherein the circuit configuration is constructed using CMOS circuit technology.

9. A memory chip, comprising:
   a programmable link being programmable with regard to its state of conduction by an energy pulse;
   a drive circuit having an input side with an activation input and an output providing the energy pulse, said drive circuit coupled to said programmable link in a manner dependent on signals present on said input side; and
   a shift register having at least one register cell for storing an activation signal, said shift register coupled to said activation input of said drive circuit for activating said drive circuit in a manner dependent on a memory content of said register cell.

* * * * *